United States Patent [19]

Harris et al.

[11] Patent Number: 5,650,638

[45] Date of Patent: Jul. 22, 1997

[54] SEMICONDUCTOR DEVICE HAVING A PASSIVATION LAYER

[75] Inventors: Christopher Harris, Sollentuna; Andrei Konstantinov, Linköping; Erik Janzén, Borensberg, all of Sweden

[73] Assignee: ABB Research Ltd., Zurich, Switzerland

[21] Appl. No.: 436,489

[22] Filed: May 8, 1995

[30] Foreign Application Priority Data

Jan. 3, 1995 [SE] Sweden .................. 9500013

[51] Int. Cl.$^6$ ........................... H01L 31/0312
[52] U.S. Cl. ............... 257/77; 257/631; 257/636; 257/646
[58] Field of Search ............... 257/77, 631, 636, 257/646, 76

[56] References Cited

U.S. PATENT DOCUMENTS

| | | | |
|---|---|---|---|
| 3,629,011 | 12/1971 | Tohi et al. | 148/1.5 |
| 3,829,333 | 8/1974 | Tohi et al. | 148/1.5 |
| 4,297,783 | 11/1981 | Casey, Jr. et al. | 257/636 |
| 4,375,125 | 3/1983 | Byatt | 29/588 |
| 4,656,101 | 4/1987 | Yamazaki | 428/620 |
| 4,824,798 | 4/1989 | Burnham et al. | 437/81 |
| 5,061,972 | 10/1991 | Edmond | 257/77 |
| 5,087,576 | 2/1992 | Edmond et al. | 437/22 |
| 5,183,684 | 2/1993 | Carpenter | 427/574 |
| 5,184,199 | 2/1993 | Fujii et al. | 257/77 |
| 5,382,822 | 1/1995 | Stein | 257/77 |
| 5,387,804 | 2/1995 | Suzuki et al. | 257/77 |
| 5,399,883 | 3/1995 | Baliga | 257/77 |
| 5,449,925 | 9/1995 | Baliga et al. | 257/77 |

FOREIGN PATENT DOCUMENTS

221598A1  4/1985  German Dem. Rep. .

OTHER PUBLICATIONS

IBM Tech. Disclosure Bulletin, vol. 38 No. 9 Sep. 1995, pp. 415–419.

Ahmed et al., Boron and Aluminum Implantation in αSiC, Appl. Phys. Lett 65(1), pp. 67–69, Jul. 1994.

Barret et all., Growth of Large SiC Single Crystals, Journal of Crystal Growth, 128 (1993), pp.358–362, Eisevier Science Publishers B.V., North Holland.

Bayerer et al., ICBT-Halbbrücken mit Ultraschnellen Dioden, etz. Bd. 108, Heft 19, 1987, pp. 922–924.

Butcher, Ultrafast Recovery Diodes, PCIM Europe, Jan./Feb. 1993, pp. 22–24.

Campbell et al., Electrical Properties of SiC Devices, in Mat. Res. Bull. vol. 4, pp. S 211–S 222, 1969, Pergamon Press Inc.

Füllmann et al., A New Fast Power Diode, PCIM Europe, Sep./Oct. 1992, pp. 191–195.

Junge et al., Verbesserung des Dynamischen Verhaltens von Rücklaufdioden in Pulswechselrichtern, etz Bd. 110, Heft 10, 1989, pp. 478–483.

Kalinina et al., Structure and Properties of Ion-Implantation-Doped p-n Junctions in Sic, Sov. Phys. Semicond. 14(6), pp. 652–654, Jun. 1980.

Khan et al., High Electron Mobility Transistor Based on a GaN–Al$_x$Ga$_{1-x}$N Heterojunction, Appl. Phys. Lett 63,(9), Aug. 1993, pp. 1214–1215.

Kopanski et al., Charge Trapping in Cubic Silicon Carbide MIS Capacitors, Springer Proceedings in Phys., vol. 56, pp. 119–124, 1992.

Kordina, Growth and Characterization of Silicon Carbide Power Device Material, Paper I, pp. 47–59, Linkoping Studies in Science and Technology, Dissertations No. 352, Dept. of Physics and Measurement Technology, Linkoping University, Sweden 1994.

Mori et al., A Novel Soft and Fast Recovery Diode (SFD) with Thin P–layer Formed by Al–Si Electrode, Proceedings of ISPSD '90, 1990, pp. 113–117.

Rao et al., Al and B Ion–Implantations in 6H–and 3C–SiC, J. Appl. Phys. 77(6), pp. 2479–2485, Mar. 1995.

Skudelny et al., Comparative Study of high Power Devices in Converter Circuits, Power Semiconductor Devices and Circuits, ed by A A Jaecklin, pp. 197–238, Plenum Press, New York 1992.

Strite et al., GaN, AiN and InN: A Review, J. Vac. Sci. Technol. B 10(4), Jul./Aug. 1992, pp. 1237–1255.

Suzuki et al., Crystal Growth of β-SiC on Si and Its Application to MOSFETs, Springer Proceedings in Phys., vol. 56, pp. 101–110, 1992.

Vodakov et al., Diffusion and Solubility of Impurities in Silicon Carbide, 1973, Trans. III, Int. Conf., University of South Carolina Press.

Vodakov et al., Electrical properies of a p–n–n$^+$ Structure Formed in Silicon Carbide by Implantation of Aluminium Ions, Sov. Phys. Semicond. 21(9), pp. 1017–1020, Sep. 1987.

David, Plasma–Assisted Chemical Vapor Deposition of Ceramic Films and Coatings, Mat. Res. Soc. Sypm. Proc. vol. 155 (1989), pp. 213–225.

Aspar et al., Auger studies of chemical bonds and oxygen minimization in the interfaces between AlN and SiC thin films deposition by LPCVD, Applied Surface Science, vol. 81 (1994), pp. 55–62.

*Primary Examiner*—Jerome Jackson
*Assistant Examiner*—John Guay
*Attorney, Agent, or Firm*—Pollock, Vande Sande & Priddy

[57] ABSTRACT

A semiconductor device comprises at least one semiconductor layer (1–3) of SiC and a layer (6) applied on at least a portion of an edge surface (19) of said SiC-layer so as to passivate this edge surface portion. At least the portion of said passivation layer closest to said edge surface portion of the SiC-layer is made of a first crystalline material, and the passivation layer comprises a portion made of a second material having AlN as only component or as a major component of a crystalline alloy constituting said second material.

20 Claims, 2 Drawing Sheets

SEMICONDUCTOR DEVICE HAVING A PASSIVATION LAYER

TECHNICAL FIELD OF THE INVENTION AND PRIOR ART

The present invention relates to a semiconductor device comprising at least one semiconductor layer of SiC and a layer applied on at least a portion of an edge surface of said SiC-layer so as to passivate this edge surface portion.

All types of semiconductor devices are comprised, such as for example different types of diodes, transistors and thyristors.

Such devices are in particular used in applications in which it is possible to benefit from the superior properties of SiC in comparison with especially Si, namely the capability of SiC to function well under extreme conditions. SiC has a high thermal stability due to a large band gap between the valence band and the conduction band, such that devices fabricated from this material are able to operate at high temperatures, namely up to 1000K. Furthermore, it has a high thermal conductivity, so that SiC devices may be arranged at a high density. SiC also has a more than 5 times higher breakdown field than Si, so that it is well suited as a material in high power devices operating under conditions where high voltages may occur in the blocking state of a device.

The passivation of the edge of a device is made for different reasons and using different means. One reason for applying a passivation layer to the edge of the device is to protect a semiconductor layer or layers of the device, especially to prevent moisture and ion migration which may damage the semiconductor layer. The passivation layer may also protect the semiconductor layer against mechanical influences and dirt. Another task of a passivation layer is to stabilise the surface region of the semiconductor layer, which then has also a stabilising effect on the properties in the bulk of the semiconductor layer. In particular, the passivating layer has to shield the semiconductor layer of the device electrically with respect to the ambient, so that electrical fields from the device will not detrimentally influence surrounding devices or equipment and primarily there will be no generation of jumping sparks at the interface between the semiconductor layer and the air and no breakdown in a blocking state of the device, when the passivation layer is applied in a region of the device where the electric field is high in a blocking state of the device.

The present invention is in particular concerned with the problem of obtaining a passivation adapted to the use of SiC as semiconducting material, so that especially the property of SiC to withstand high temperatures and high breakdown fields may be utilized.

$SiO_2$ has until now often been used as a passivation layer, since it is easily created by thermal oxidation, but it is not adapted for use in SiC-devices. $SiO_2$ may not withstand the high breakdown voltages which are required to be possible in the application of SiC-power devices, such a passivation layer would be partially destroyed by said extreme high voltage, and a lack of appropriate passivation of such devices would thereto not only result in a decrease of the breakdown voltage, but in an irreversible, destructive mode of electric breakdown in the device as well. Furthermore, $SiO_2$ may not be grown thick enough to hold extreme high voltages and it has also a lower dielectric constant than SiC. $SiO_2$ may also not be stable at higher temperatures, the interface between the SiC-semiconductor layer and the $SiO_2$ layer is known to be unstable at temperatures above 300° C.

These drawbacks are also present in other conventional dielectrics used for passivation purposes, such as SiO and $Si_3N_4$.

It is also known that the capability to withstand high voltages in the blocking state of such a device can be improved by different geometric tricks preventing a concentration of the electric field at the edge of the device, such as bevelled edge surfaces having different inclinations. It is also known that the application of a semi-insulating material as a passivation layer in the region of a device where the electric field is high in a blocking state of the device, allows a weak leakage current to flow in the blocking state of the device, thereby smoothing out the electric field in said region.

Furthermore, all the conventional passivation layers used as passivation layers for a SiC-device will result in a comparatively high trapping density at the interface between the SiC and the passivation layer due to disorders at the interface. This will result in an unstable surface region of the device and a low stability and reliability of the function of the device in said region, leading to electric field peaks or spots having a lower breakdown field than other parts of the passivation layer. Such instabilities make it necessary to set the limit for the highest allowed voltage in the blocking state of the device considerably lower than would be possible if the interface region be just as or nearly as stable and uniformly built up as the bulk region of the device.

SUMMARY OF THE INVENTION

The object of the present invention is to provide a semiconductor device as defined in the introduction, which has a passivation making it possible to withstand breakdown fields close to the physical limit of SiC and be thermally stable in the temperature range in which SiC-devices may operate.

This object is in accordance with the invention, obtained by making at least the portion of said passivation layer closest to said edge surface portion of the SiC-layer of a first crystalline material, and by that the passivation layer comprises a portion made of a second material having crystalline AlN as only component or as a major component of a crystalline alloy constituting said second material.

By using crystalline AlN as only component or as a major component of a crystalline alloy constituting said second material as a portion of the passivation layer, the passivation layer may withstand high breakdown fields and have a high thermal stability. AlN has nearly the same dielectric constant as SiC and is able to withstand electric fields of a greater magnitude than SiC. Furthermore, AlN is thermally stable within the possible temperature range of operation of SiC-devices and importantly has substantially the same coefficient of thermal expansion as SiC. The fact that at least the portion of the passivation layer closest to the edge surface portion of the SiC-layer is made of a crystalline material, makes a very important contribution to the capability of such a device to withstand high breakdown fields. Due to the use of a crystalline material for the passivation layer next to the SiC semiconductor layer the disorder and by that the trapping density at the interface there between is dramatically reduced with respect to the use of known passivation materials. Accordingly, the interface between the passivation layer and the semiconductor layer will get a nearly "bulk-like"-character, so that there will be no dramatic fluctuation of the electric field at the interface or in the passivation layer portion closest to said interface and this passivation layer portion will have a uniform ability to withstand electric fields, so that higher electric fields may be allowed in the blocking state of the device without any risk of the occurrence of an electrical breakdown due to an inhomogeneity in the passivation.

According to a preferred embodiment of the invention said first material of the passivation layer is substantially lattice-matched to SiC and has substantially the same coefficient of thermal expansion as SiC, which will make it possible to obtain an extreme low interface trap density with the advantages mentioned above as well as a possibility to grow thick and mechanically stable layers of said first material next to the SiC-layer.

According to another preferred embodiment of the invention said first crystalline material is said second material, i.e. a material having crystalline AlN as only component or as a major component of a crystalline alloy constituting said material is arranged closest to said edge surface portion of the SiC-layer. AlN has a 2 H structure and will match under given orientations with all types of SiC polytypes, both cubic and hexagonal ones, and it has a good lattice-match with a misfit of only 0.7%.

According to a further preferred embodiment of the invention said passivation layer is applied at least in a region of the device where the electric field is high in a blocking state of the device and it comprises at least two superimposed sub-layers of which one is made of said second material and another is made of a semi-insulating material allowing a weak leakage current to flow therein, in said blocking state of the device for smoothing out the electric field in said region. These characteristics will make it possible to withstand high electric fields owing to the high breakdown field and the stability of the second material defined above and the capability of the layer of the semi-insulating material to smooth out the electric field otherwise concentrated in said region.

According to a still further preferred embodiment of the invention the sub-layer applied on the SiC-layer, i.e. said first crystalline material, is made of a semi-insulating material, and the sub-layer made of said second material is arranged on the top of that semi-insulating material. This embodiment of the invention as well as a further preferred embodiment thereof, in which the sub-layer made of said second material is applied on the SiC-layer and the layer made of the semi-insulating material is arranged on the top of said second material layer, results in high breakdown fields.

According to another preferred embodiment of the invention in which the first crystalline material is said second material and the passivation layer is applied at least in a region of the device where the electric field is high in a blocking state of the device, said second material is lightly N-doped to provide electrons as free charge carriers at the interface between the SiC-layer and the layer of the second material so as to make a weak current flow at said interface in said blocking state of the device for smoothing out the electric field in said region. By using AlN as at least major component of the material at the interface between the SiC-layer and the passivation layer and doping it with donors, the band off-set of the conduction bands between AlN and SiC may be utilised to obtain electrons as free charge carriers at said interface with the same electric field smoothing out property as provided by a semi-insulating layer there. AlN has a band gap of about 6.2 eV, which is considerable larger than all polytypes of SiC, which have band gaps between 2.3 and 3.3 eV. AlN has energy band off-sets for both the conduction band and the valence band for all the SiC polytypes, which in the case of doping AlN with donors will result in a "falling down" of electrons at the interface from the AlN to the SiC conduction band at said interface. These free electrons may then be influenced by a voltage to move along said interface so as to smooth out the electric field in the region in question.

According to another embodiment of the invention, in which the AlN layer is lightly doped with acceptors instead, positive holes will in a corresponding way be provided at said interface as free charge carriers for smoothing out the electrical field in the region in question. In this case the band-off-set between the valence bands of AlN and SiC is utilised.

Further advantages and preferred features of the invention will appear from the following description and the other dependent claims.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS OF THE INVENTION

Figure 1:
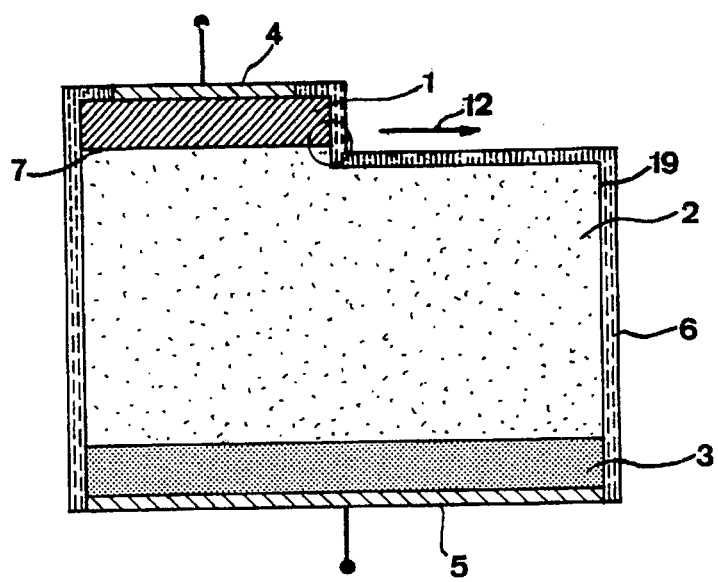
FIG. 1 is a schematic view of a semiconductor diode of SiC being passivated in accordance with the invention.

FIG. 1 illustrates by a way of a non-limitative example of a device to which the invention may be applied, a semiconductor diode with three semiconductor layers of SiC, namely a first highly doped layer 1 of P-type, a second lightly doped layer 2 of N-type and a third highly doped layer 3 of N-type. The three layers are superimposed in the order mentioned. The device does also have an ohmic metal contact 4 arranged on the top of said first layer and forming the anode of the diode, and a second ohmic metal contact 5 arranged in contact with said third semiconductor layer and forming the cathode of the diode. The device is encapsulated and the edges 19 of the device are passivated by a passivation layer 6 covering the entire device with exception of the two contacts 4 and 5. The device may be produced by known growing and etching techniques. In a conventional way, the device will be conducting when a positive voltage is applied to the metal contact 4 in contact with the layer of P-type and blocking when a negative voltage is applied to that contact with respect to the potential of the second contact 5. In the blocking state of the device the electric field will be concentrated to the PN-junction 7 between said first and second layers, and the requirements of the passivation will be highest in that region so as to make it possible for the device to withstand as high voltages as possible without any breakdown.

Figure 2:
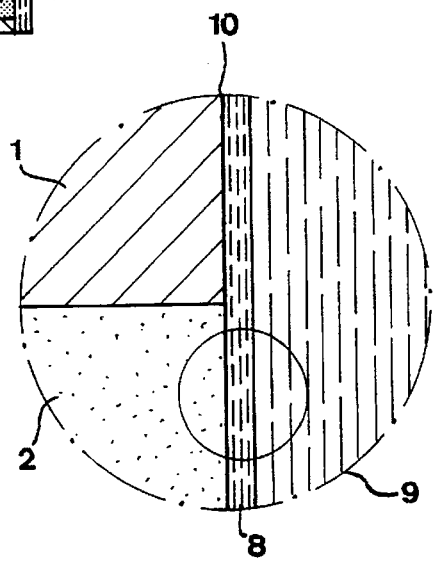
FIG. 2 is an enlarged view of a portion of the device according to FIG. 1 in which the electric field is high in a blocking state of the device.

FIG. 2 shows how the passivation layer may comprise two superimposed sub-layers 8 and 9 of which that closest to the semiconductor edge is made of a monocrystalline material, in the present embodiment of AlN. AlN has already been grown with a high quality on SiC. The AlN-layer may also have some minor concentrations of one or several other Group 3B-nitrides or SiC. The crystalline layer 8 with AlN as major component may be grown on the SiC layers 1, 2, 3 in such a way that the interface 10 between the sub-layer 8 and the semiconductor layers will be substantially without any disorder and by that have a very low trap density. AlN has a very high breakdown field and may withstand very high fields without the occurrence of any damages thereon, so that in this case first of all a comparatively thin layer of AlN is applied on the semiconductor edge surfaces so as to take up a considerable part of the electric field, and another sub-layer of a material which may not withstand such high electric fields without any damage thereof may be arranged on top of the AlN-layer 8 to take up the residual of the electric field. This layer 9 may be done much thicker than the AlN-layer and will be of any suitable insulating material, such as for example an organic material, such as a polymide or any amorphous insulating layer. Thus, the layer 9 will be there for taking up a part of the electric field and prevent breakdowns from occurring, but it is primarily there for reducing the electric field at the external surface thereof to such an extent that surrounding equipment or devices will not be influenced thereby.

Figure 3:
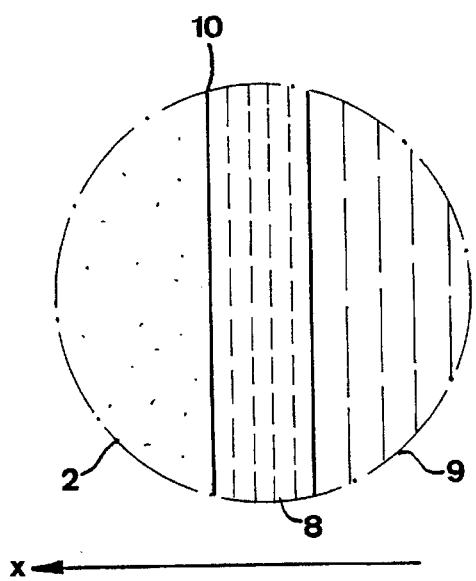
FIG. 3 is a further enlarged view of an interface part of the portion shown in FIG. 2 with an illustration of the extension of the valence and conduction bands in the SiC-layer and in the passivation sub-layer closest to the SiC-layer when this is made of said second material, and what happens when said second material is lightly doped with donors.
Figure 3:
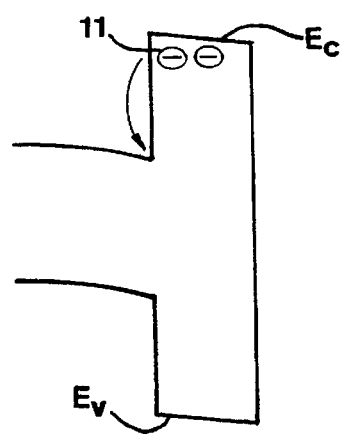

FIG. 3 illustrates what is happening when the sub-layer 8 in FIG. 2 is lightly doped with donors. Due to the off-set of the conduction band levels $E_c$ between aluminium nitride and silicon carbide the donated electrons 11 of the sub-layer 8 will energetically fall down to the conduction band of the SiC next to said interface 10. Accordingly, free charge carriers in the form of electrons are in this way provided at said interface. This means, that the interface will act as a semi-insulating layer in that a weak leakage current will flow along said interface when a voltage is applied in the blocking direction of the device. This means that the electrical field will be smoothed out by extending the surface depletion layer in the direction of the arrow 12 in FIG. 1. Accordingly, this means that the device may withstand higher blocking voltages before breakdown occurs. However, it is important to dope the layer 8 to a very low extent, because leakage currents are principally not desired and should therefore be kept within low limits.

The corresponding phenomena may be achieved by doping the AlN-layer 8 with acceptors and using the band off-set between AlN and SiC with respect to the energy levels $E_v$ of the valence bands and obtaining positive holes as free charge carriers at the interface 10.

Figure 4:
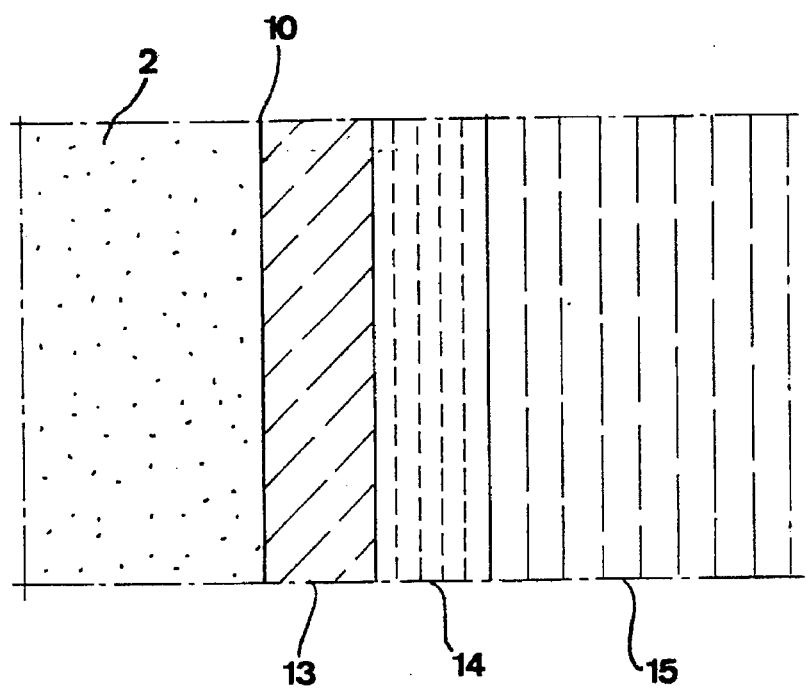
FIG. 4 and 5 are views similar to FIG. 3 showing the arrangement of passivation sub-layers in devices according to the second and third embodiment of the invention, respectively.

FIG. 4 shows an embodiment according to the invention with a passivation layer comprising three superimposed sub-layers 13, 14 and 15. The sub-layer 13 applied on the semiconductor layer 2 is made of a crystalline, semi-insulating material, i.e. of a material having a high resistivity, but which allow a weak leakage current to flow therein in the blocking state of the device so as to smooth out the electrical field in the same way as described above with reference to FIG. 3. Thanks to the crystalline property of the material of the sub-layer 13 the trapping density at the interface 10 will be low and by that the stability at the interface high. The sub-layer 14 arranged on top of the semi-insulating layer 13 is made of said second material, i.e. crystalline AlN or a crystalline alloy having AlN as a major component. This sub-layer is intended to take up a large part of the electrical field. Finally, the sub-layer 15 corresponds to the sub-layer 9 in the embodiment according to FIG. 2.

Figure 5:
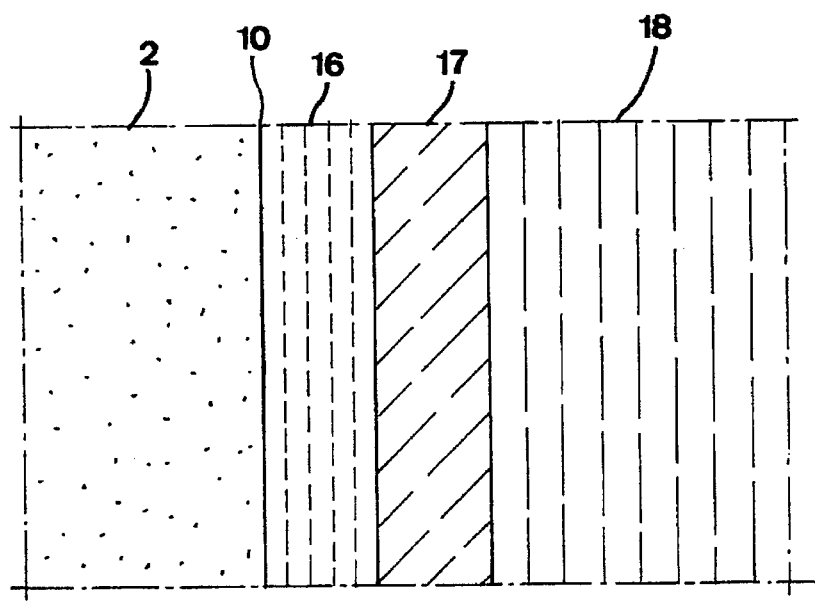

FIG. 5 shows a further embodiment of the invention in which the passivation layer comprises three superimposed sub-layers 16, 17, 18 of which the sub-layer 16 applied on the semiconductor layer 2 is made of said second material and has the same purpose as the layer 8 of FIG. 2 but is undoped. The sub-layer 17 arranged thereon is made of a semi-insulating material, which does not necessarily have to be crystalline, and this layer allows a weak leakage current to flow therein in the blocking state of the device so as to smooth out the electric field in the region in which it is high. The external sub-layer 18 corresponds to the sub-layer 15 of FIG. 4 and the sub-layer 9 of FIG. 2.

The invention is of course not in any way restricted to the preferred embodiments described above, but many possibilities to modifications thereof will be apparent to a man with ordinary skill in the art.

As mentioned in the introduction the invention is applicable to all types of semiconductor devices which require passivation, also unipolar semiconductor devices, where the electric field is high close to the source and high breakdown fields must be sustained there.

The proportions of the different layers shown in the figures do not have anything to do with reality, but are only chosen for illustration reasons and can be totally different. Although the passivation layer is shown to be much thinner than the SiC-layer, these layers may have approximately the same thickness or the SiC-layer may even be thinner than the passivation layer. It would also be possible to grow the second material directly onto the SiC semiconductor layer that thick that no other layer has to be applied thereon for taking up any part of the electric field, but in practice a rubber coating or the like will nevertheless probably always be applied outside the layer of the second material. The choice of the thicknesses of the different layers will in practice depend on the conditions under which the device in question is intended to operate and the procedures of production of said layers (degree of complication, production time etc.).

The second material may consist of an alloy having AlN as major component and one or a combination of Group 3B-nitrides and SiC as the other component or components, since these different components have a complete miscibility. However, AlN has to be the major component, since the ability thereof to withstand high electric fields is superior and it has a better lattice-match to SiC, which is of importance when the second material is arranged next to the SiC-layer of the device.

It will of course be possible to cover different surfaces of the device by different passivation layers and adapt the nature of the passivation layer to the conditions prevailing in the different regions of the device. It is also within the scope of the invention to leave areas of the device without any passivation layer according to the invention.

All definitions concerning the materials of the different device layers do of course also include inevitable impurities as well as intentional doping when SiC is concerned.

The definition layer is to be interpreted broadly and comprise all types of volume extensions and shapes.

The word crystalline means a good periodicity of the lattice in the three dimensions over greater regions, i.e. typically polycrystalline structures are excluded.

We claim:

1. A semiconductor device comprising at least one semiconductor layer (1-3) of SiC having an edge surface (19) and a passivation layer (6) applied on at least a portion of said edge surface (19) of said SiC-layer and terminating said edge surface of said SiC layer thereby electrically isolating it from the surrounding ambient so as to thereby passivate said portion of said edge surface and wherein at least that portion (8, 13, 16) of said passivation layer closest to said portion of said edge surface of said SiC layer is made of a first crystalline material, and wherein the passivation layer comprises a second and other portion (8, 14, 16) made of a second and different material having crystalline AlN as only component or as a major component of a crystalline alloy constituting said second material.

2. A device according to claim 1, characterized in that said first material is substantially lattice-matched to SiC and has substantially the same coefficient of thermal expansion as SiC.

3. A device according to claim 1, characterized in that said second material is constituted by said alloy and the other component or components than AlN thereof is one or a combination of Group 3B-nitrides and SiC.

4. A device according to claim 1, characterized in that said second material has crystalline AlN as only component.

5. A device according to claim 1, characterized in that said first crystalline material is said second material.

6. A device according to claim 1, wherein said semiconductor layer contains doping and wherein said passivation layer (6) is applied at least in a region of the device where the electric field is high in a blocking state of the device, and wherein said passivation layer comprises at least two superimposed sub-layers of which one (14, 16) is made of said second material and another (13, 17) is made of a semi-insulating material allowing a weak leakage current to flow therein in said blocking state of the device for smoothing out the electric field in said region.

7. A device according to claim 6, characterized in that the sub-layer applied on the SiC-layer (1–3) is the one (13) made of a semi-insulating material, and that the sub-layer (14) made of said second material is arranged on the top of that semi-insulating material layer.

8. A device according to claim 6, characterized in that the sub-layer (16) made of said second material is applied on the SiC-layer (1–3), and that the layer (17) made of the semi-insulating material is arranged on the top of said second material layer.

9. A device according to claim 5, wherein said semiconductor layer contains doping and wherein said passivation layer (6) is applied at least in a region of the device where the electric field is high in a blocking state of the device, and wherein said second material is lightly N-doped to provide electrons as free charge carriers at the interface between the SiC-layer (1–3) and the layer (8) of the second material so as to make a weak current flow at said interface in said blocking state of the device for smoothing out the electric field in said region.

10. A device according to claim 5, wherein said semiconductor layer contains doping and wherein said passivation layer is applied at least in a region of the device where the electric field is high in a blocking state of the device, and wherein said second material is lightly P-doped to provide positive holes as free charge carriers at the interface between the SiC-layer (1–3) and the layer of the second material so as to make a weak current flow at said interface in said blocking state of the device for smoothing out the electric field in said region.

11. A device according to claim 1, which comprises at least two adjacent semiconductor layers (1, 2) of SiC of which a first is N-doped and a second is P-doped, characterized in that said passivation layer portion of said first material is applied on the edge surface (19) of the SiC-layer of the PN-junction between the two SiC-layers for passivation of the edge surfaces on both sides thereof.

12. A device according to claim 1, characterized in that said passivation layer (16) comprises at least two superimposed sub-layers of which one (8, 14, 16) is made of said second material and another, external sub-layer (9, 15, 18) is made of another material being insulating.

13. A device according to claim 12, characterized in that said external sub-layer (9, 15, 18) is made essentially thicker than said layer (8, 14, 16) of said second material.

14. A device according to claim 2, characterized in that said first crystalline material is said second material.

15. A device according to claim 3, characterized in that said first crystalline material is said second material.

16. A device according to claim 4, characterized in that said first crystalline material is said second material.

17. A device according to claim 2, wherein said semiconductor layer contains doping and wherein said passivation layer (6) is applied at least in a region of the device where the electric field is high in a blocking state of the device, and wherein said passivation layer comprises at least two superimposed sublayers of which one (14, 16) is made of said second material and another (13, 17) is made of a semi-insulating material allowing a weak leakage current to flow therein in said blocking state of the device for smoothing out the electric field in said region.

18. A device according to claim 3, wherein said semiconductor layer contains doping and wherein said passivation layer (6) is applied at least in a region of the device where the electric field is high in a blocking state of the device, and wherein said passivation layer comprises at least two superimposed sublayers of which one (14, 16) is made of said second material and another (13, 17) is made of a semi-insulating material allowing a weak leakage current to flow therein in said blocking state of the device for smoothing out the electric field in said region.

19. A device according to claim 4, wherein said semiconductor layer contains doping and wherein said passivation layer (6) is applied at least in a region of the device where the electric field is high in a blocking state of the device, and wherein said passivation layer comprises at least two superimposed sublayers of which one (14, 16) is made of said second material and another (13, 17) is made of a semi-insulating material allowing a weak leakage current to flow therein in said blocking state of the device for smoothing out the electric field in said region.

20. A device according to claim 5, wherein said semiconductor layer contains doping and wherein said passivation layer (6) is applied at least in a region of the device where the electric field is high in a blocking state of the device, and wherein said passivation layer comprises at least two superimposed sublayers of which one (14, 16) is made of said second material and another (13, 17) is made of a semi-insulating material allowing a weak leakage current to flow therein in said blocking state of the device for smoothing out the electric field in said region.

* * * * *